US007706558B2

(12) United States Patent
Sack et al.

(10) Patent No.: US 7,706,558 B2
(45) Date of Patent: Apr. 27, 2010

(54) AUTOMATED SYSTEM FOR ADJUSTING LINE ARRAY SPEAKERS

(76) Inventors: Domonic Sack, 8 Wake Robin La., Stamford, CT (US) 06903; Robert Kodadek, 30 Bard Ave., Staten Island, NY (US) 10310

( * ) Notice: Subject to any disclaimer, the term of this patent is extended or adjusted under 35 U.S.C. 154(b) by 1178 days.

(21) Appl. No.: 10/846,108

(22) Filed: May 14, 2004

(65) Prior Publication Data

US 2005/0008165 A1 Jan. 13, 2005

Related U.S. Application Data

(60) Provisional application No. 60/470,813, filed on May 14, 2003.

(51) Int. Cl.

| | |
|---|---|
| ***H04R 29/00*** | (2006.01) |
| ***H04R 3/00*** | (2006.01) |
| ***H04R 1/40*** | (2006.01) |
| ***H04R 1/02*** | (2006.01) |
| ***H03G 5/00*** | (2006.01) |

(52) U.S. Cl. ........................... 381/335; 381/98; 381/59; 381/336; 381/96; 381/97

(58) Field of Classification Search .................. 381/96, 381/97, 95, 89, 77, 80, 336, 82, 59, 98, 335
See application file for complete search history.

(56) References Cited

U.S. PATENT DOCUMENTS

| | | | | |
|---|---|---|---|---|
| 5,819,959 | A * | 10/1998 | Martin | 211/118 |
| 6,568,726 | B1 * | 5/2003 | Caspi et al. | 292/341.16 |
| 6,652,046 | B2 | 11/2003 | Christner | 312/111 |
| 2002/0136414 | A1 * | 9/2002 | Jordan et al. | 381/58 |

* cited by examiner

*Primary Examiner*—Vivian Chin
*Assistant Examiner*—George C Monikang
(74) *Attorney, Agent, or Firm*—Levisohn Berger LLP

(57) ABSTRACT

The invention relates to an automated system for adjusting line array speakers. The automated system includes a system for moving two or more speakers with a moving device. Additionally, moving two linear actuators essentially simultaneously; a bracket to attach to the moving device to the speaker; a remote control system for controlling the movement of the speakers and for displaying the position of the speakers in real time; and a system for modeling and determining the proper frequency response for a venue and automatically adjusting the linear array speaker systems to the proper position for the proper frequency response.

26 Claims, 14 Drawing Sheets

FIG. 9
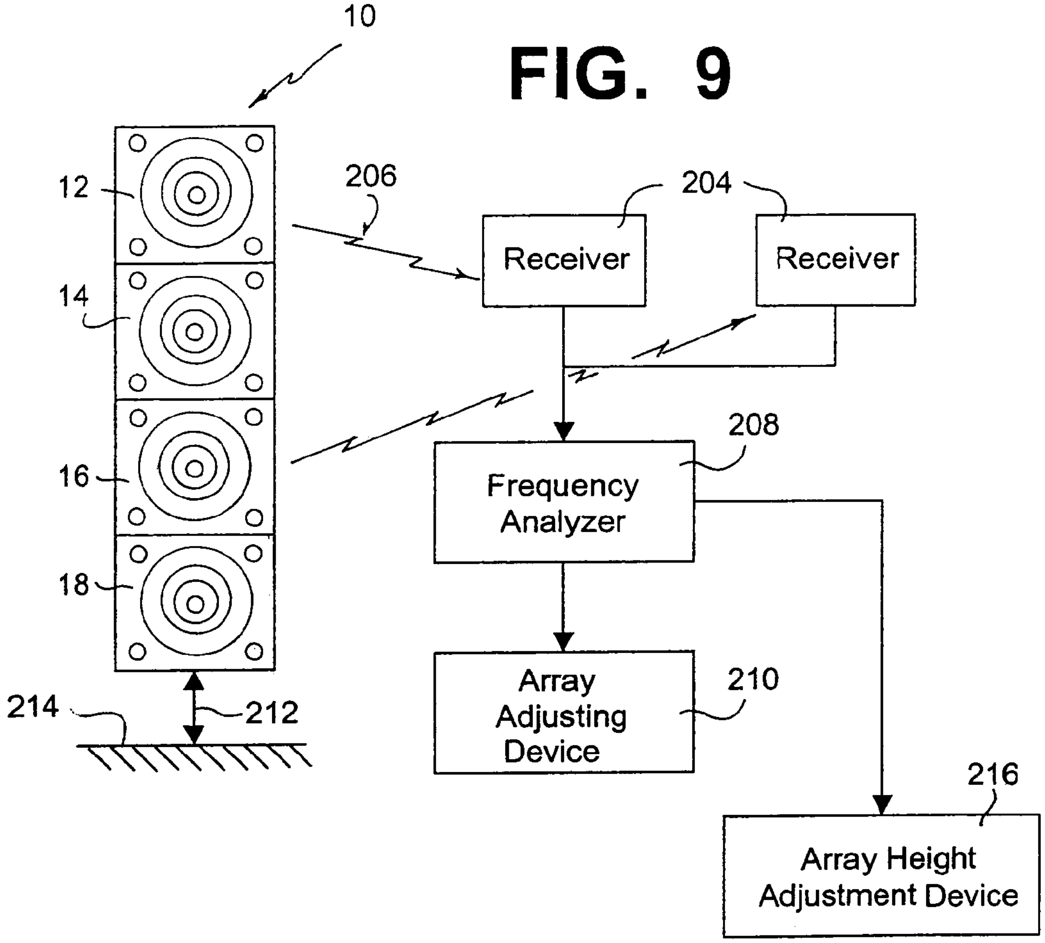
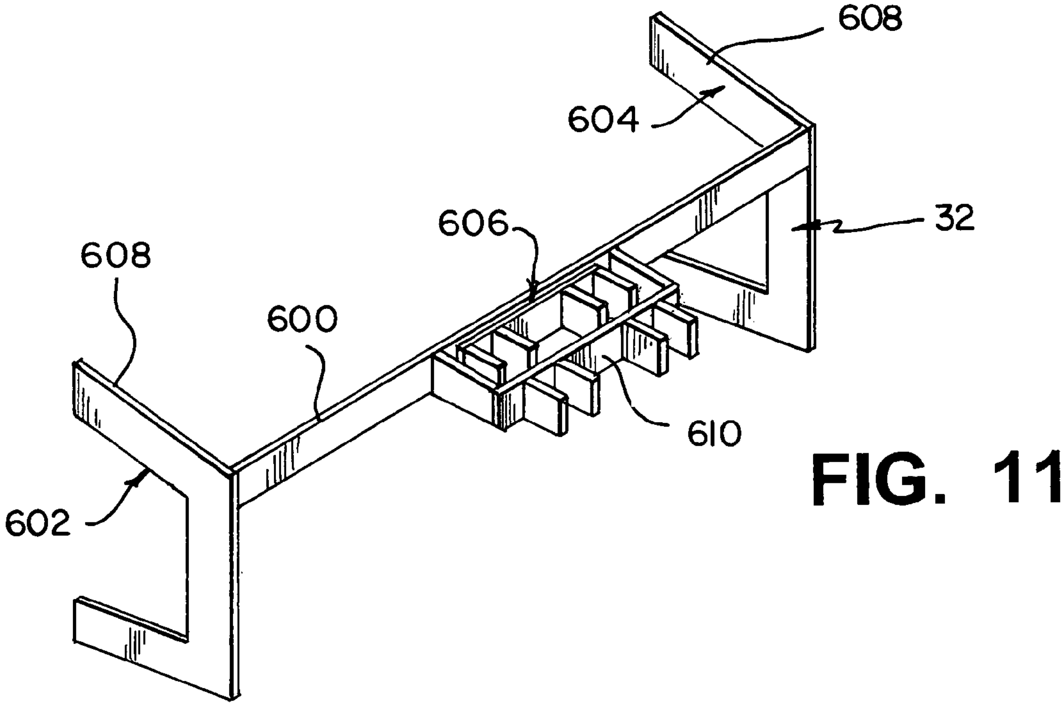
FIG. 11

AUTOMATED SYSTEM FOR ADJUSTING LINE ARRAY SPEAKERS

This application claims priority pursuant to 35 U.S.C. §119 from Provisional Patent Application Ser. No. 60/470,813 filed May 14, 2003, the entire disclosure of which is hereby incorporated by reference.

BACKGROUND OF THE INVENTION

1. Field of the Invention

This invention relates to a system of moving line array speakers, including a system to allow two linear actuators to move essentially simultaneously, a bracket to support the array, a remote control to move the actuators and a method of testing the frequency response of a line arrays in a venue and automatically adjusting the line arrays to achieve the optimum frequency response.

2. Discussion of the Related Art

The entertainment industry is one of the largest grossing industries in the world and audio systems are used to support this industry for theatrical productions, concerts, and movies. The audio systems are typically high-end speaker systems because high fidelity sound is required to ensure the audience receives the highest quality audio experience during an event.

Previous speaker systems are stacked up from the floor to achieve a specific height above the audience to create the proper frequency response. A proper frequency response allows every member of the audience to hear the event with the same clarity. Additionally, problems such as echo and distortion are created due to obstacles in the venue (i.e. columns) or the improper placement of the speakers in the system.

Problems with the stacking arrangement are that the speaker systems can only be stacked to a certain height and the stacked height may not be the height required to achieve the proper frequency response for the entire venue. The speakers were always set to the same angle, and thus were very difficult to adjust the frequency response.

Technology to correct some of the shortcomings of the floor stacked speaker system is a line array speaker system. The line array speaker system can either be suspended from the ceiling of a venue or stacked on the floor. The line array speaker system allows for even frequency response over large areas.

The speakers within the line array acoustically couple with each other depending on the angles that separate the individual speakers. Changing the angles between the speakers can control this coupling affect, which in turn, allows the user of the line array extensive control over the frequency response of the system. Currently, changing the angle between the speakers must be done by hand at ground level.

When a line array system is set up, metal spacers must be placed between the speakers to allow the user to create angles that would best suit the speaker placement in the venue. The angles are set in relation to the speaker below it. Thus, if the angle of the top most speaker requires an adjustment, every speaker in the array must be adjusted.

Currently, a line array is assembled by "stacking" speakers in a vertical column. Each speaker can weigh between approximately 100 and 500 pounds. The array is assembled and the angle between each speaker in the array is set. The frequency response of the line array is then tested. If the frequency response requires adjustment, the spacing between the speakers must be adjusted. Depending on which speaker requires adjustment, the entire array must be dissembled and reassembled with the new spacing. The above process is repeated until the proper frequency response for the venue is achieved. This trial and error process requires time and man power. The time and labor required adds additional costs to events. Additionally, since the line arrays are designed to be suspended, additional time is required to raise and lower the array in order to make the necessary adjustments.

Previously, the angles for each venue were determined once the line array system was in place at the venue. Presently, angle measurements can be determined, using software, prior to arriving at a venue, for example, MAPP (Multifunctional Acoustical Prediction Program) Online™ by Meyer Sound Laboratories. The software can be programmed to model acoustical aspects of a venue, while simulating the affects of angle changes within a line array. Most software can only simulate a sectional view of a venue, and it cannot take into consideration obstacles that project from the side of a theater or hall. The software allows a user to acquire basic angle estimates, but cannot be used to make precise angle adjustments within a venue. The precision adjustments must still be done, by trial and error, according to the requirements of the venue in which the array is arranged. Currently, no systems are available that computer models the venue in real time with the line arrays in position.

Thus, there is a need in the art for remote controlled system that can adjust the angles between individual speakers in a line array without having to disassemble the array and also while the speaker array is suspended from the ceiling. Additionally, there is a need in the art for an automated system to model and adjust the line arrays, in the actual venue, with minimum human intervention.

SUMMARY OF THE INVENTION

The invention relates to an automated system for adjusting line array speakers. The automated system includes a system for moving two or more speakers with a moving device. Additionally, moving two linear actuators essentially simultaneously; a bracket to attach to the moving device to the speaker; a remote control system for controlling the movement of the speakers and for displaying the position of the speakers in real time; and a system for modeling and determining the proper frequency response for a venue and automatically adjusting the linear array speaker systems to the proper position for the proper frequency response.

BRIEF DESCRIPTION OF THE DRAWING FIGURES

The above and still further objects, features and advantages of the present invention will become apparent upon consideration of the following detailed description of a specific embodiment thereof, especially when taken in conjunction with the accompanying drawings wherein like reference numerals in the various figures are utilized to designate like components, and wherein.

Figure 3A:
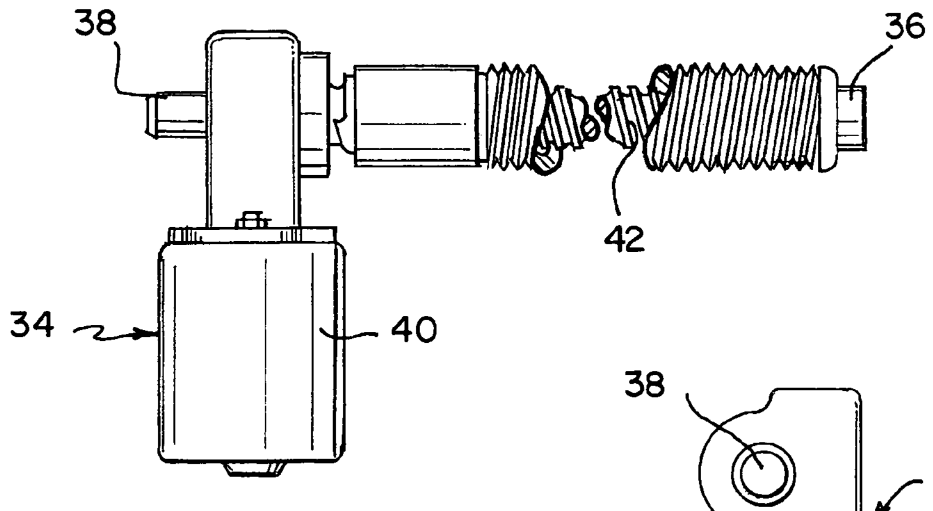
Figure 3B:
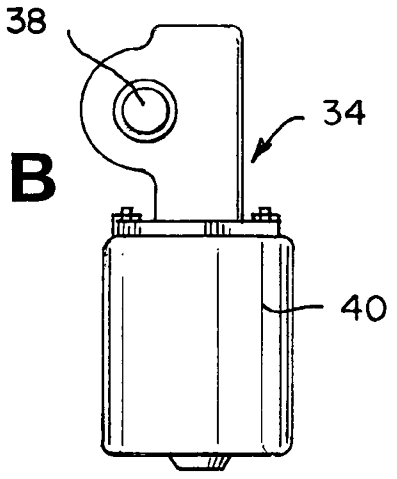

FIG. 3*a* is a side and partial cross sectional view of the linear actuators of the present invention;

FIG. 3*b* is a rear view of the linear actuator of FIG. 3*a;*

Figure 4A:
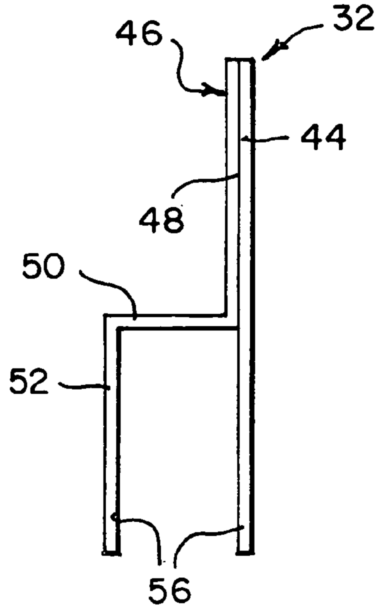
Figure 4B:
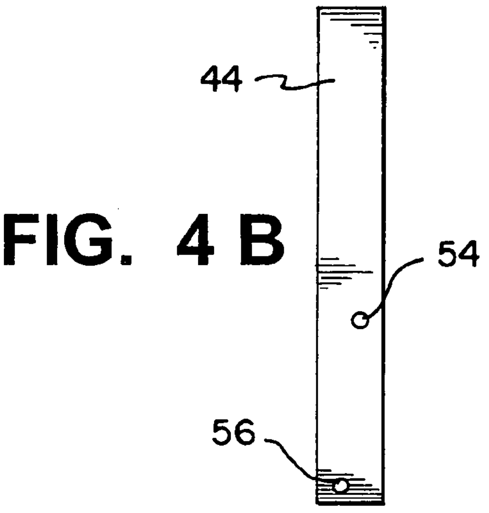
Figure 4C:
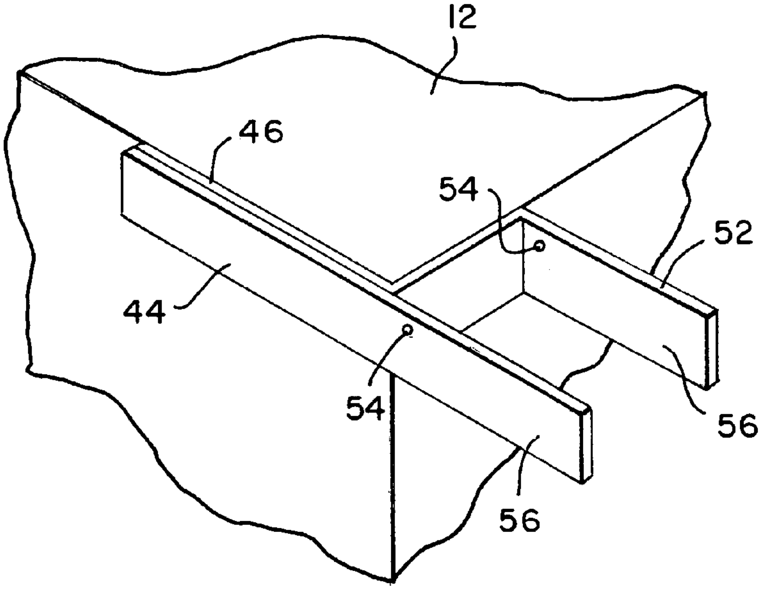
Figure 5A:
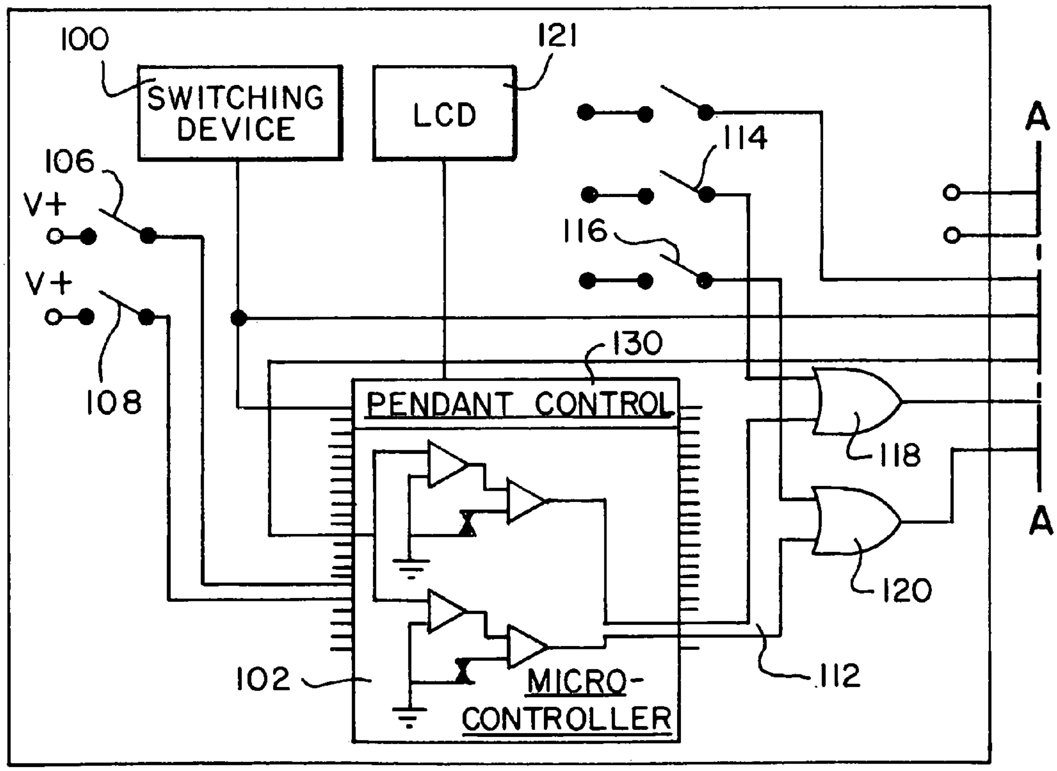
Figure 5B:
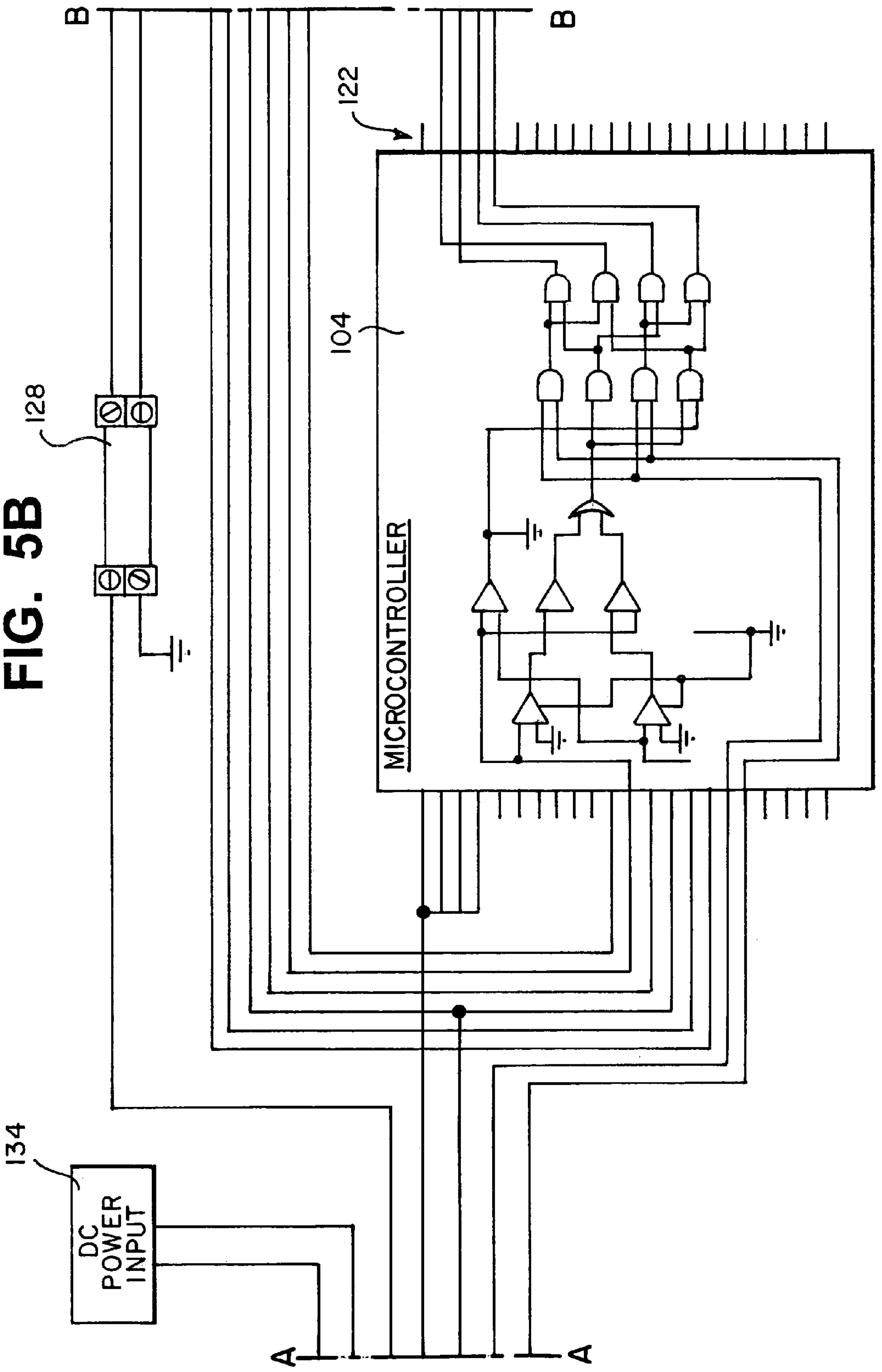
Figure 5C:
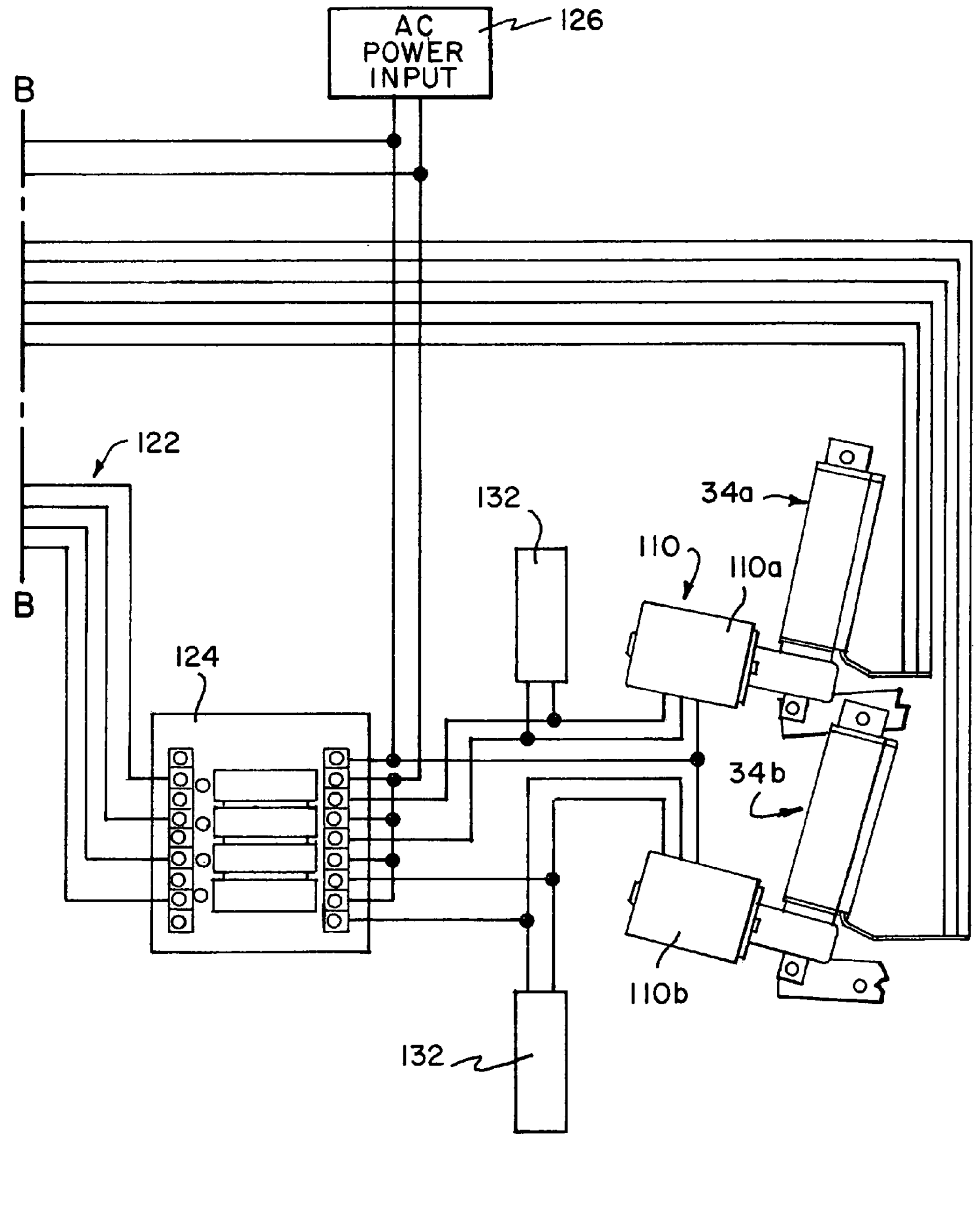
Figure 6:
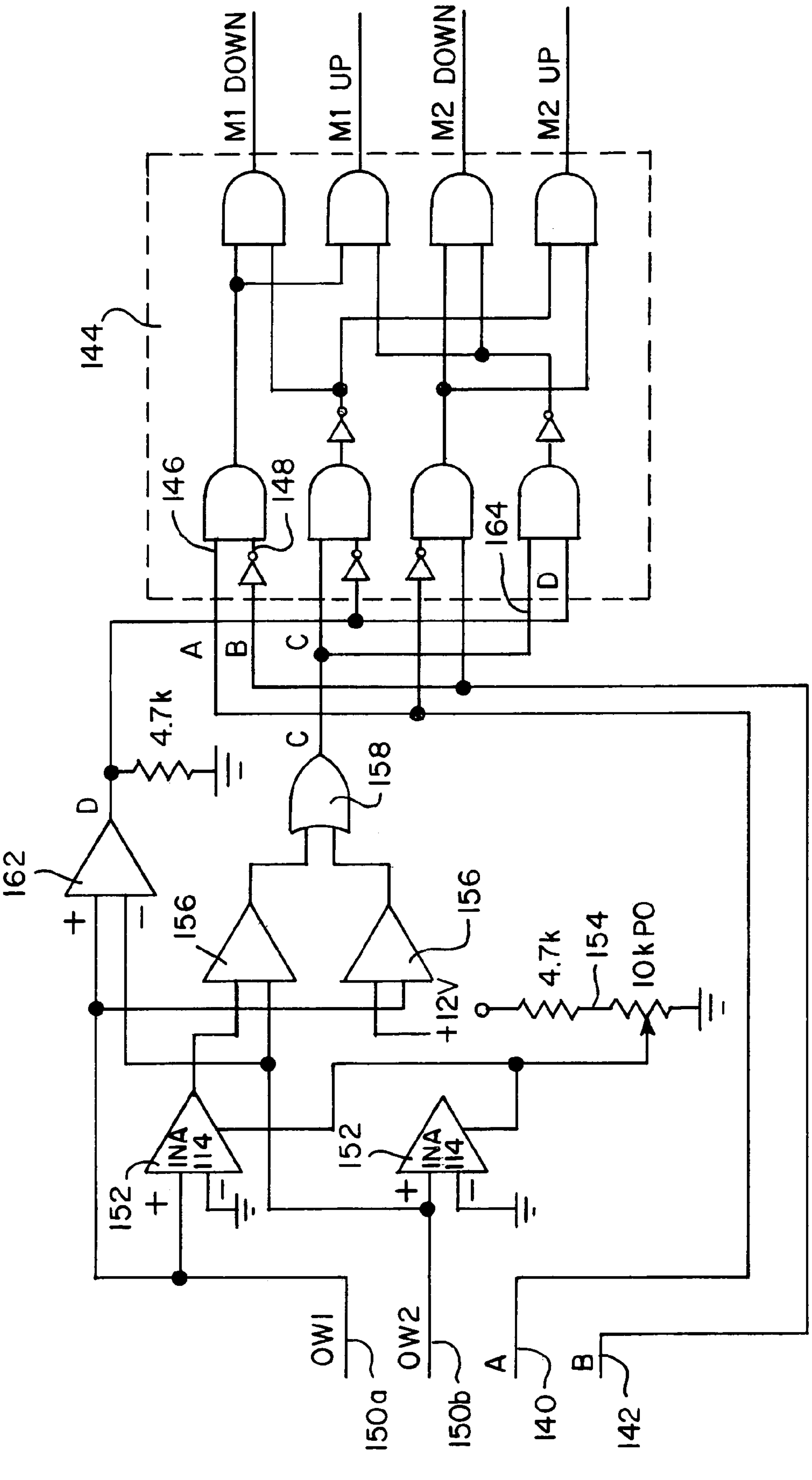
Figure 7A:
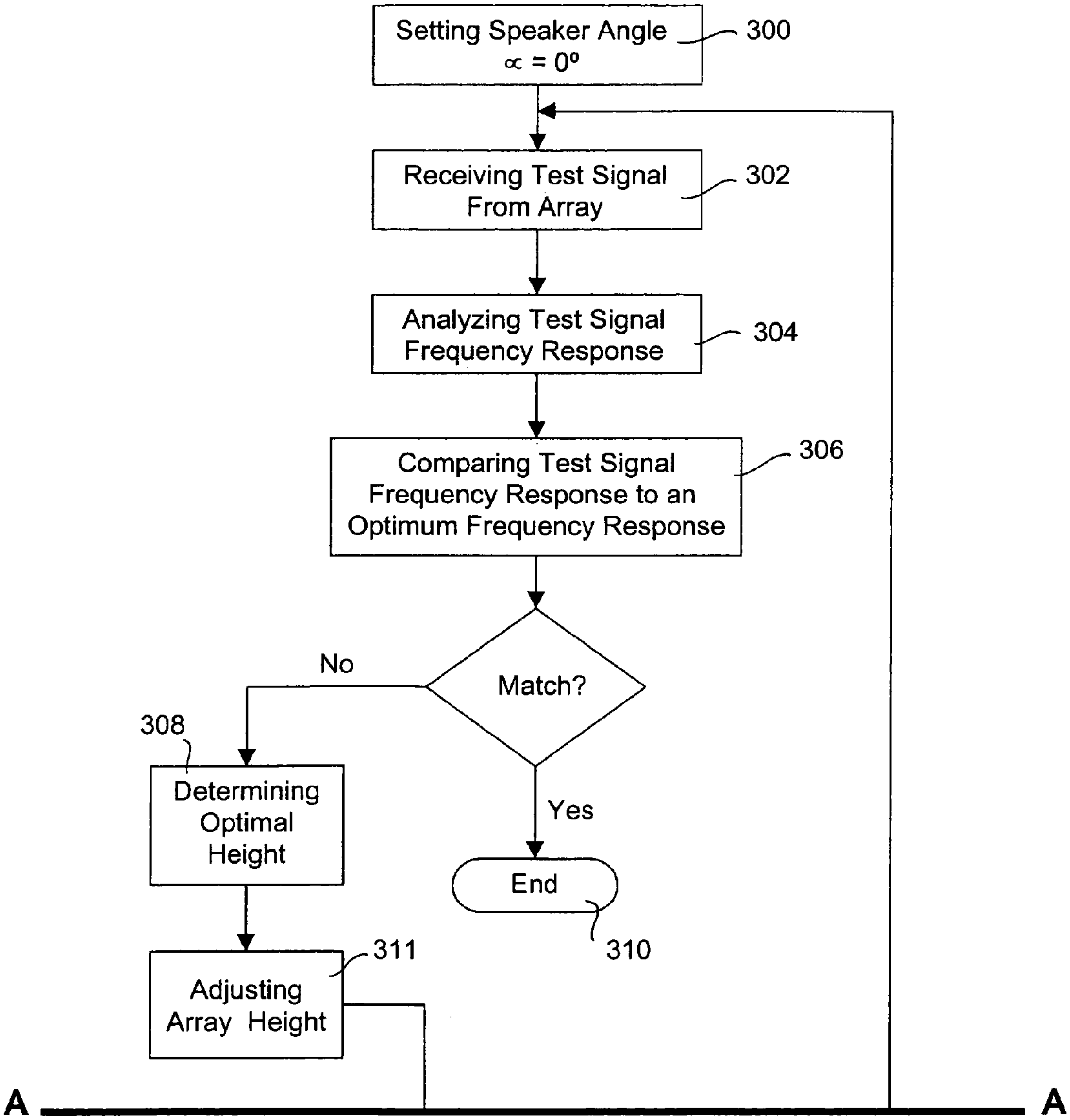
Figure 7B:
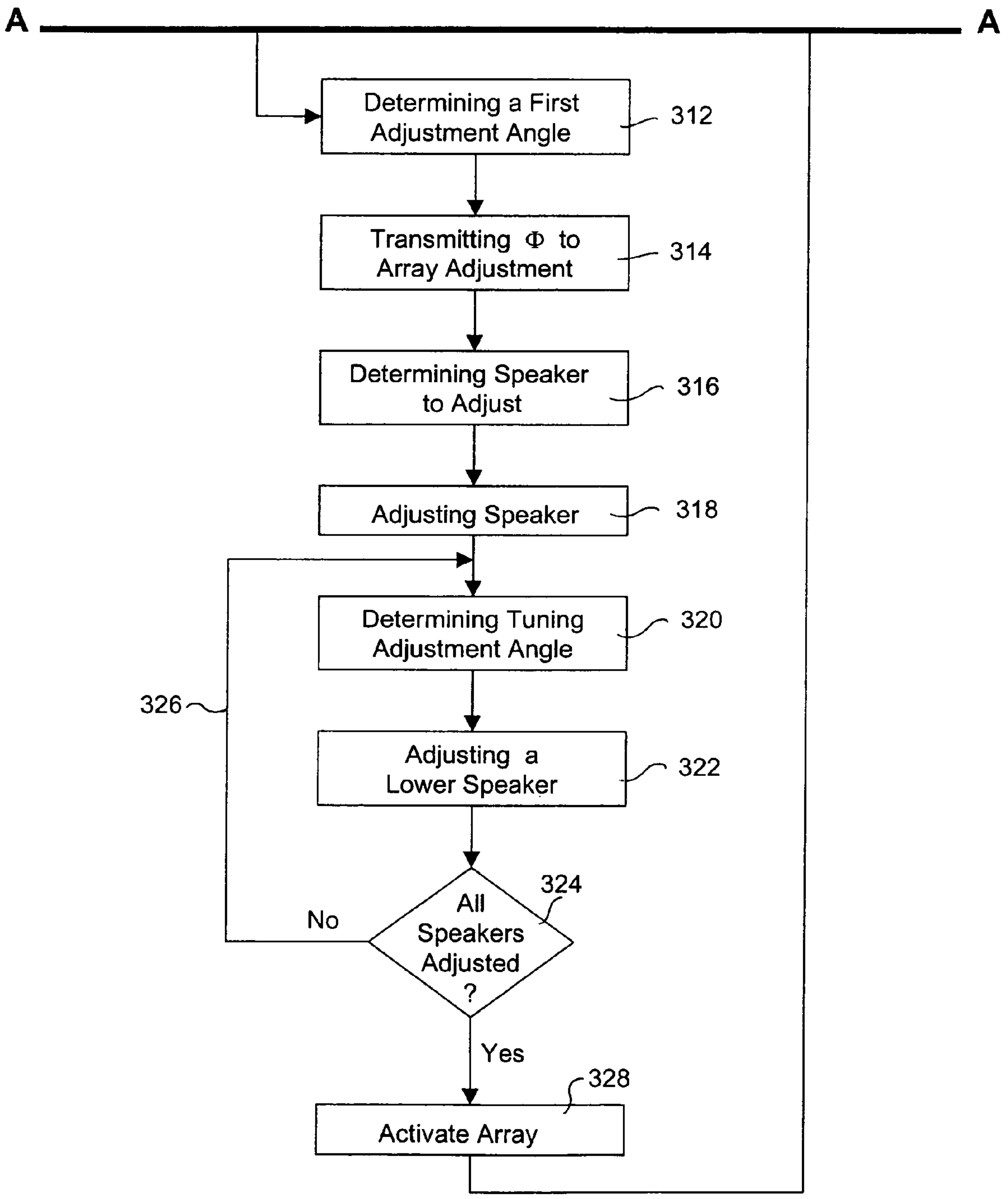
Figure 8:
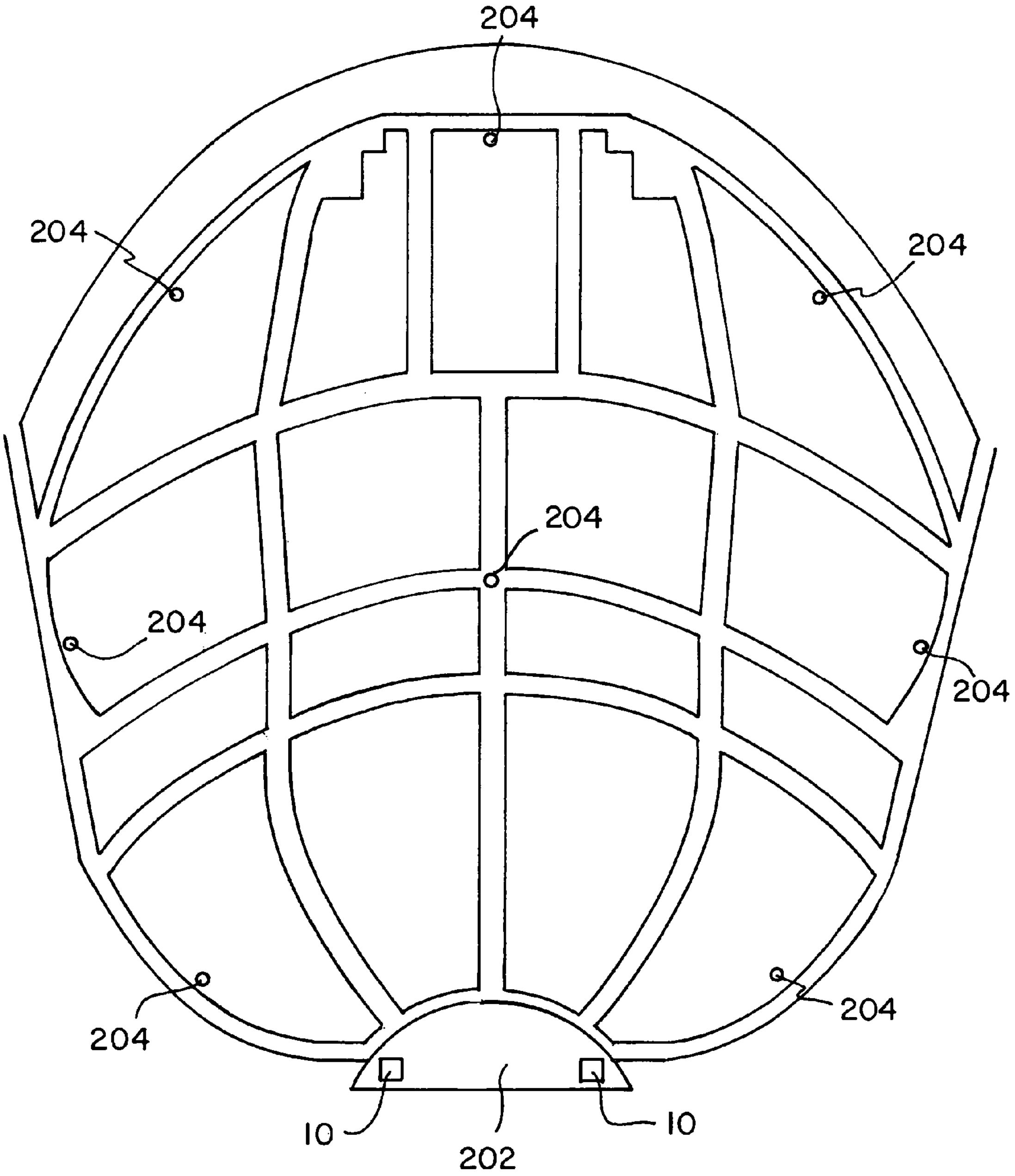
Figure 10A:
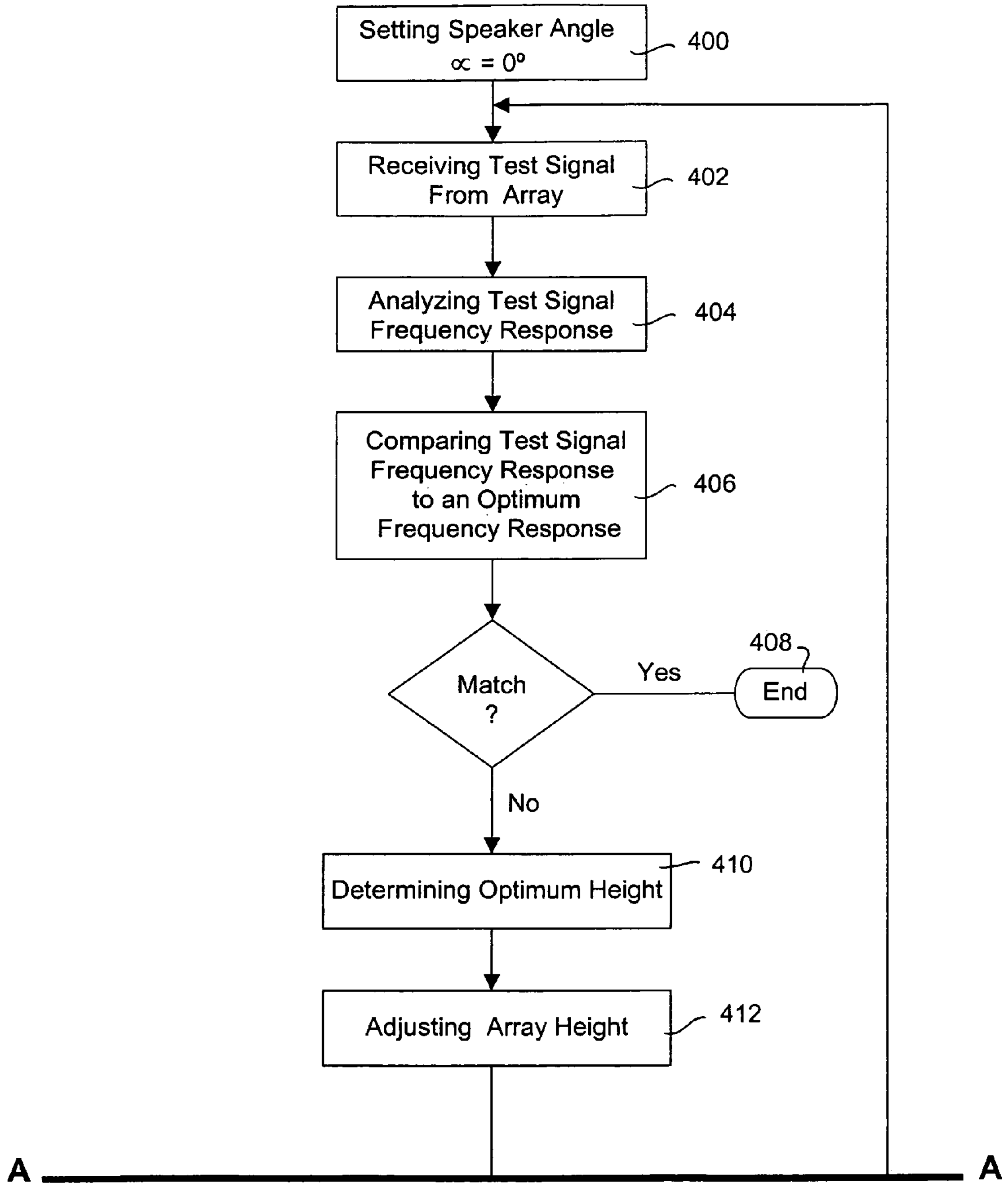
Figure 10B:
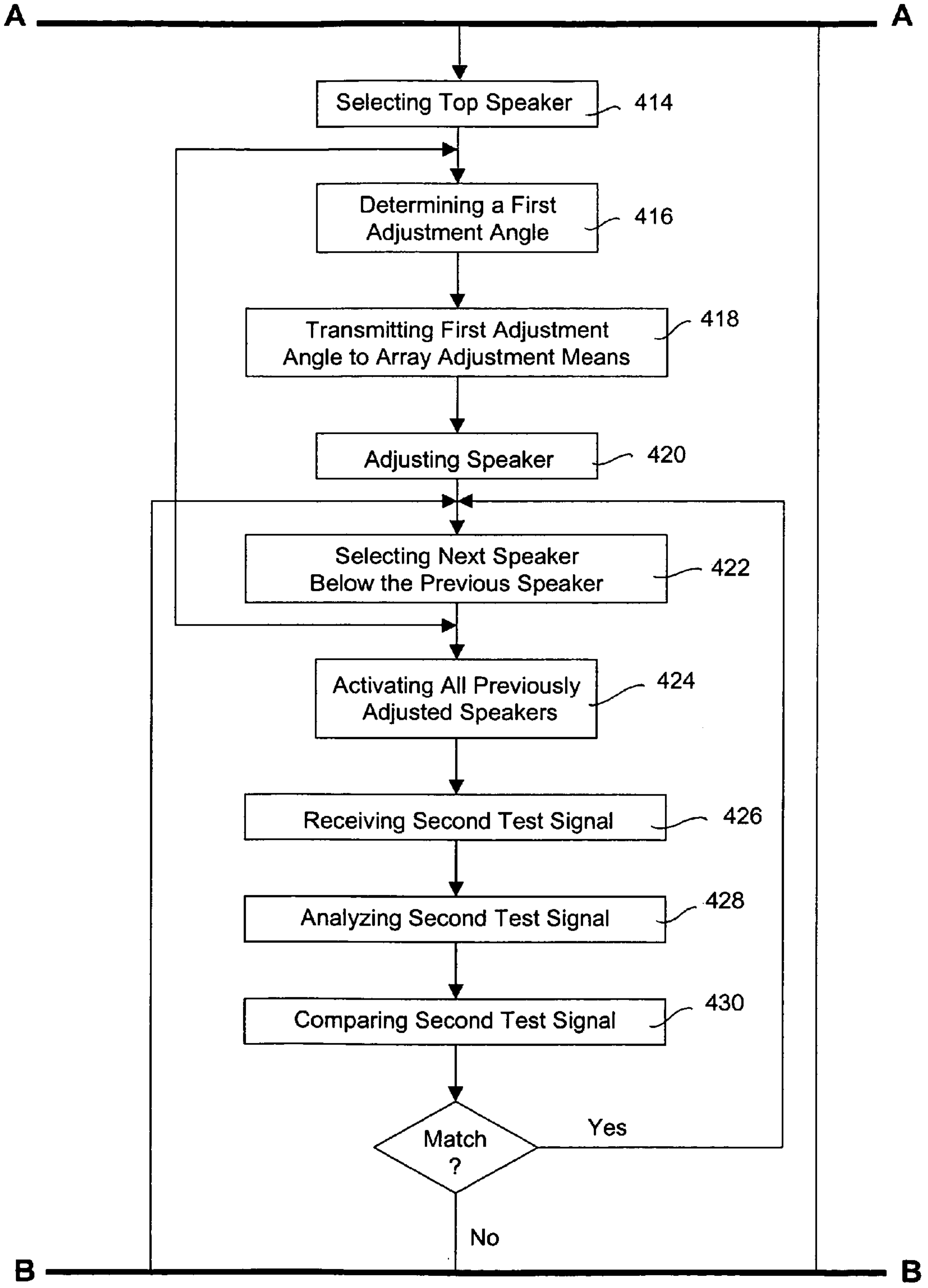
Figure 10C:
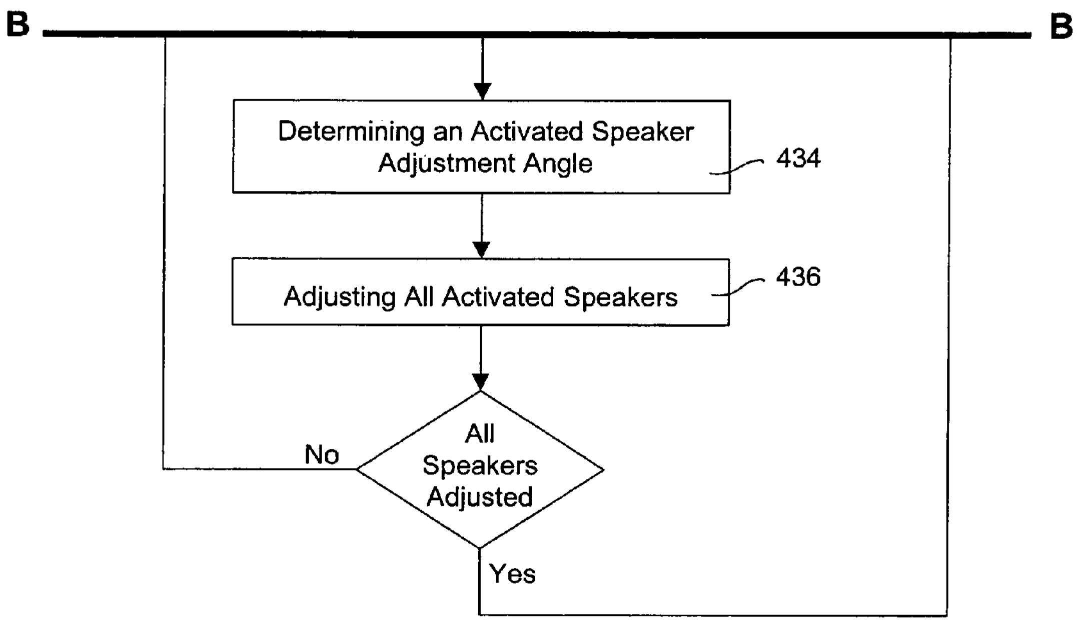

FIGS. 4*a*-4*c* are top, side and perspective views of the bracket of the present invention;

FIGS. 5*a*-5*c* are line diagrams of the motion control circuitry of the present invention;

FIG. 6 is a circuit diagram displaying the hysteresis and potentiometer comparison circuit of the present invention;

FIGS. 7A and 7B are flowcharts of an embodiment of the computer analysis program of the present invention;

FIG. 8 is a top view of the placement of the present invention in a venue;

FIG. 9 is a block diagram of one embodiment of the frequency analysis system of the present invention;

FIGS. 10A, 10B and 10C are flowcharts of another embodiment of the computer analysis program of the present invention; and FIG. 11 is a perspective view of another embodiment of the speaker bracket.

DETAILED DESCRIPTION OF THE PREFERRED EMBODIMENT

Figure 1:
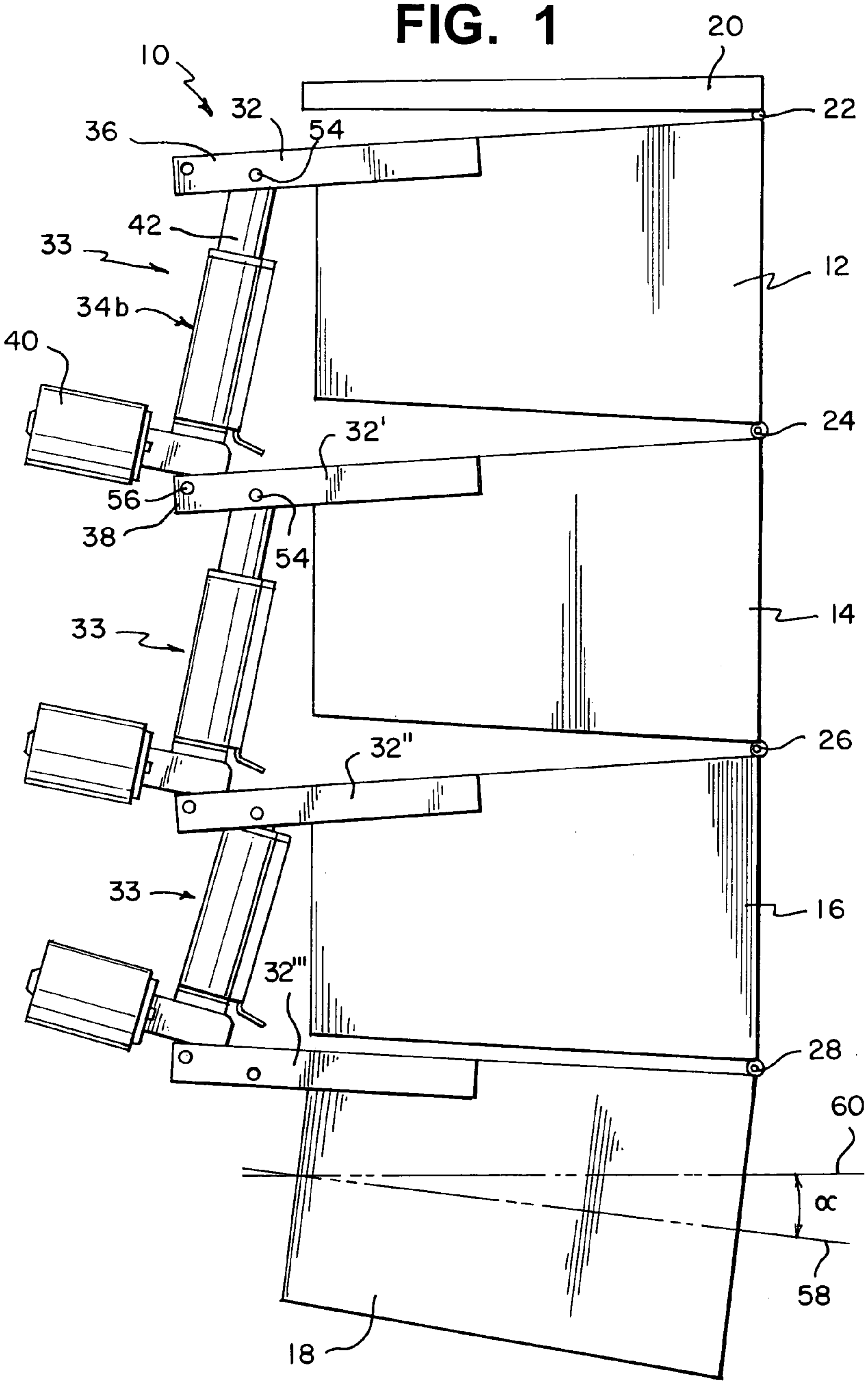
FIG. 1 is a right side view of a line array system of the present invention.
Figure 2:
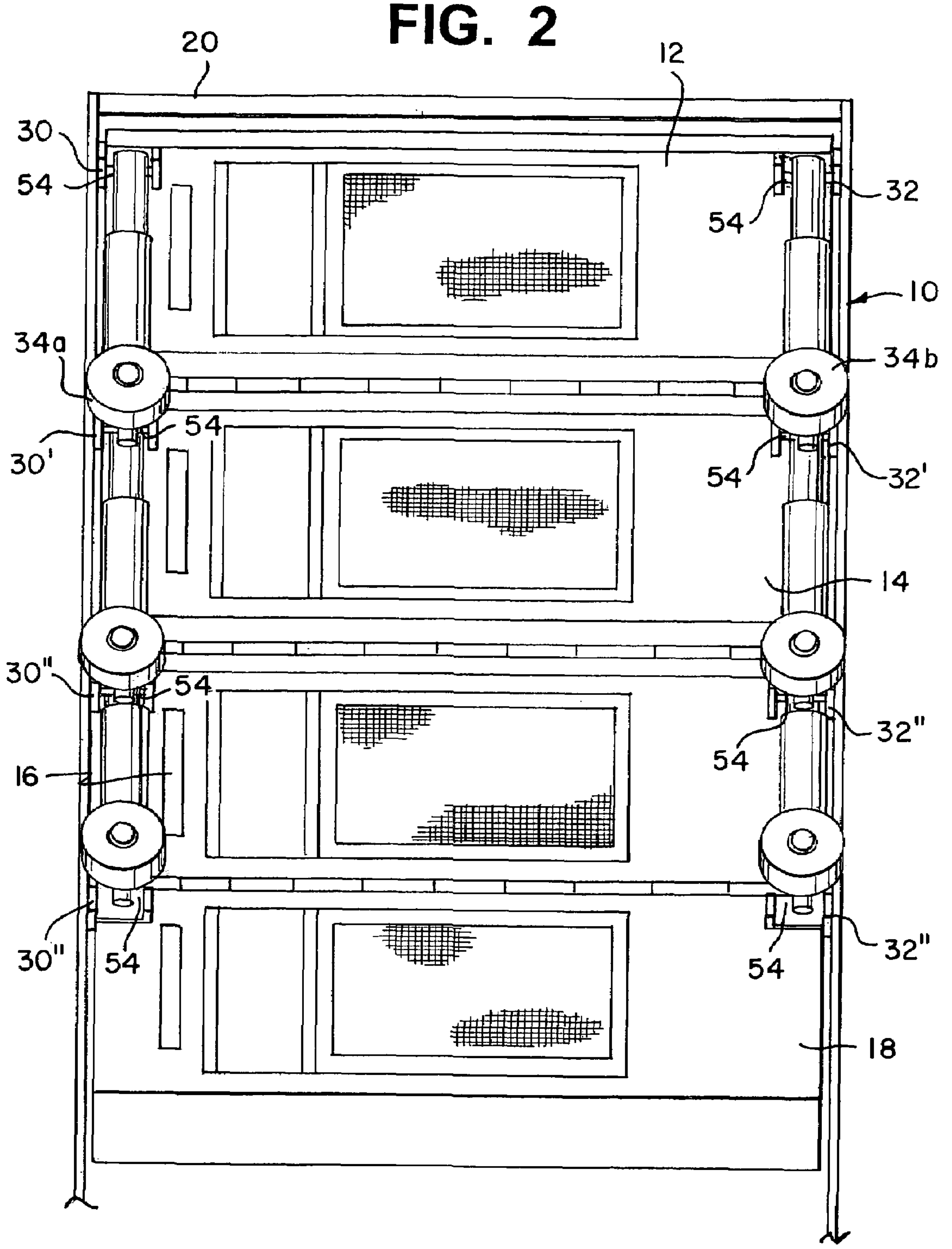
FIG. 2 is a back view of the present invention.

Referring now to FIGS. 1 and 2, a line array speaker system 10 includes four speakers 12, 14, 16, 18 and the speakers are suspended from a support 20. The top speaker 12 and the lower speakers 14, 16, 18 are attached to support 20 or the next speaker in array 10 via pivot points 22, 24, 26, 28. Pivot points 22, 24, 26, 28 allow each speaker 12, 14, 16, 18 to pivot independently of the support 20 or the speaker above. Array 10 further includes support brackets 30, 30', 30", 30"', 32, 32', 32", 32"' one for each of the left and right sides of speakers 12, 14, 16, 18 and a moving device 33 to alter the angular position of each speaker 12, 14, 16, 18.

Turning to the preferred embodiment, moving device 33 is a pair of linear actuators 34 to move each speaker, and actuators 34 are mounted, for example as a left actuator 34*a* and a right actuator 34*b*. Each actuator 34 includes an extension end 36, a fixed end 38, a motor 40 and a worm shaft 42 (FIGS. 3*a* and 3*b*). FIG. 1 illustrates the right side of array 10 and will be used as an example for mounting right actuator 34*b* to support bracket 32. The same bracket configuration for support bracket 30 and mounting arrangement is used for the left side of array 10. Further, this or similar mounting schemes can be used to mount moving device 33. FIGS. 1 and 2 illustrate pivot points 22, 24, 26, 28 located at the front of speakers 12, 14, 16, 18 and moving device 33 mounted on the rear of speakers 12, 14, 16, 18. Another embodiment (not illustrated) disposes pivot points 22, 24, 26, 28 at the rear of speakers 12, 14, 16, 18 and moving device 33 at the front.

FIGS. 4*a*, 4*b* and 4*c* illustrate support bracket 32 including an arm 44 and a 'Z' shaped arm 46. 'Z' shaped arm 46 includes speaker attachment section 48, transverse section 50 and actuator attachment section 52. Arm 44 attaches to one side of speaker attachment section 46 and extends essentially parallel to actuator attachment section 52. Both actuator attachment section 52 and arm 44 have extension end engagement holes 54 and fixed end engagement holes 56. Extension end 36 of actuator 34 is attached to support bracket 32 via extension end engagement holes 54 and fixed end 38 of actuator 34 is attached to support bracket 32 of the next speaker via fixed end engagement holes 56. For example, support bracket 32 is attached to speaker 12 via speaker attachment section 46 and another support bracket 32' is attached to speaker 14 is a similar fashion. Extension end 36 of actuator 34*b* is pivotaly attached to extension end engagement holes 54 of support bracket 32. Fixed end 38 of actuator 34*b* is pivotaly attached to fixed end engagement holes 56 of support bracket 32'. Each support bracket, actuator and speaker combination is arranged in such a manner, on both the left and right side of array 10. Array 10 is arranged is such a fashion so when, for example, actuator 34 is extended to pivot speaker 12, speaker 14 also pivots. When speaker 12, 14, 16, 18 are arranged is the above fashion, linear actuator 34*a* must move essentially simultaneously with linear actuator 34*b* to move the entire speaker without causing undue torque to the speaker and to array 10. Actuators 34 can also be mounted in an "upside down" position wherein fixed end 38 is mounted to bracket 32 and extension end 36 is mounted to bracket 32'.

Additionally, the embodiment above discloses moving device 33 as actuator 34. One of ordinary skill in the art can replace actuator 34 with any movement device that displaces an object in a linear fashion. For example, moving device 33 can be a mechanical, hydraulic or electrical jack or piston.

Another embodiment (not illustrated) disposes a single bracket 32 and moving device 33 to pivot speaker 12. The use of one or more brackets 32 and moving device 33 depends on the weight of speakers 12, 14, 16, 18, the power of moving device 33 and the number of speakers in array 10.

A stroke of each moving device 33 is preset to pivot a center line of the speaker 58 an angle $\alpha$ relative to a horizontal plane 60. In one embodiment, the stroke length of actuator 34 is calibrated to pivot center line of a speaker 58 $-7°$ from horizontal plane 60. In FIG. 1, moving device 33 is attached between speaker 16 and speaker 18 is fully retracted and speaker 18 is pivoted angle $\alpha$ from horizontal plane 60. Moving device 33 or actuators 34 attached between speaker 12 and speaker 14 and between speaker 14 and speaker 16 are set to a specific length, greater than fully retracted, to maintain center line 58 at a 0° angle to horizontal plane 60. Retracting extension end 36 of moving device 33 disposed between speaker 14 and speaker 16 causes speaker 16 to pivot about pivot point 26. The movement also causes speaker 18 to pivot an additional amount past the original angle $\alpha$.

In another embodiment, moving device 33 can be disposed inside speaker 12, 14, 16, 18. An aperture (not illustrated) is formed in speaker 12, 14, 16, 18 to allow extension end 36 to extend beyond speaker 12, 14, 16, 18. Fixed end 38 can be disposed on the lower corner of the speaker. This embodiment can be used for new speakers where the moving device and speakers are combined into the same cabinet. The bracket embodiments can be used to retrofit existing speakers. Additionally, the above embodiments can be used for arrays 10 ground stacked in addition to hanging embodiment described above.

Another feature of the present invention relates to controlling two or more linear actuators to operate essentially simultaneously. One embodiment of the present invention, as described above, requires two linear actuators to pivot one speaker. Both actuators must extend and retract essentially the same distance in essentially the same time. Undue torque is applied to the array if one actuator lags behind the other. One motor control circuit embodiment described below can control multiple linear actuators so that the actuators extend and retract within a tolerance of millimeters.

A motor control circuit can control multiple linked moving devices having a micro controller, a switch, having an extension position and a retraction position, sending a general position to the micro controller. The general position is the position the speaker should be in. A first measurement device reads a first position and transmits it the micro controller and a second measurement device reads a second position and transmits it to the micro controller. The micro controller compares the first and the second positions to the general position, and if the first position does not approximately equal the general position, the micro controller causes a power signal to be transmitted to the first motor. Accordingly, if the second position does not approximately equal the general position, a power signal is transmitted to the second motor.

Referring now to FIGS. 5*a* to 5*c*, the motor control circuitry to control moving device 33 or, for example, actuators 34 as a linked pair is illustrated. A switching device 100 outputs binary numerals to a micro controller 102 and a second micro controller 104. Switching device 100 allows a user to choose a particular set of actuators 34 to control, by signaling the micro controllers 102 and 104 to switch the designated actuator set within their programming and output stage. Switches 106, 108 provide a low voltage and high voltage (down and up) signal to micro controller 102. The low voltage signal equates to retracting actuator 34 and pivoting center line of speaker 58 away from horizontal plane 60 to form or increase angle α, moving speaker 12 "down." The high voltage signal equates to extending the actuator 34 and pivoting center line of speaker 58 toward horizontal plane 60 to decrease angle α, moving speaker 12 "up." Actuators 34 include a measurement device, e.g. a potentiometer, digital encoders, gyroscopes and angular sensors, to determine the movement of the moving device or the angle between the speakers.

In one embodiment a potentiometer is used to read a resistance (in ohms) generated across a motor 110. Micro controller 102 receives a potentiometer input from a left motor 110*a* of actuator 34*a* and a potentiometer input from a right motor 110*b* of actuator 34*b*. Micro controller 102 compares potentiometer input of actuator 34*a* to an equivalent voltage. The equivalent voltage is pre-programmed in micro controller 102. The equivalent voltage is a value relative to the angle measurement. Thus, there is a constant voltage value when the speaker is at 0°, 1°, etc. A user sets these values by determining the length the actuators are to extend or retract to. The equivalent voltage is input to micro controller 102 using switches 106 and 108. Depending on whether the equivalent voltage is greater than or less than the value provided by potentiometer input of actuator 34*a*, the micro controller outputs 112 provide low voltage or high voltage signals to signal a required extension or retraction of extension end 36 of actuator 34. Micro controller output 112 and switches 114, 116, provide signal to OR gates 118, 120. OR gates 118, 120 dictate logic level inputs 140, 142 of second micro controller 104. LCD 121 displays information regarding angle α, motor selection, and other critical details.

The position of left actuator 34*a* and right actuator 34*b* are determined from a voltage value read from the potentiometers mounted to the shaft of left and right actuators 34*a*, 34*b*. Micro controller 102 is calibrated so a known set of angle equivalent voltage values are programmed and available for comparison with measured potentiometer inputs. As mentioned above, every position of actuators 34 have an accompanying voltage value. Additionally, every position of actuators 34 translates into angle α for each speaker. Thus, every angle α has a constant and accompanying equivalent voltage value. For example, to set speaker 14 of FIG. 1 to α=0°, actuators 34 are not necessarily at either the fully retracted or the fully extended position. The position is dictated by comparison to the known angle equivalent voltages programmed within the micro controller. This angle value is set by the user in micro controller 102 which performs the comparison and outputs a display to LCD 121.

An output 122 of second micro controller 104 transmits either a positive voltage (+V) or a zero voltage (0V) signal to a relay block 124. Relay block 124 allows AC power 126 to flow to motors 110 in designated direction and this allows the actuators to extend or retract depending on which relay allows AC to flow.

A master relay 128 allows AC power 126 to be controlled at pendant control 130. Master relay 128 acts as a safety for the entire system. If master relay 128 is not activated, power cannot feed relay block 124. If the power is not fed to relay block 124 none of the above processes will be active. Capacitors 132 provide starting power to motors 110. A DC power input 134 provides power for all dc circuitry.

Referring now to FIG. 6, motor control circuitry/secondary micro controller 104 program is illustrated. Inputs 140, 142 receive signals from OR gates 118, 120, respectively. The signals feed inputs 146, 148 of a logic network 144. Potentiometer outputs 150*a*, 150*b* from motors 110*a* and 110*b*, respectively, feed inputs of instrumentation amplifiers 152. Instrumentation amplifiers 152 add a variable voltage 154 to each input signal. The outputs of instrumentation amplifiers 152 are modified by adding voltage to the potentiometer inputs which creates hysteresis within the circuit. This hysteresis creates an offset which provides the comparison a decrease in accuracy, allowing it to be controlled as accurately as the user decides is needed. The outputs of instrumentation amplifiers 152 are compared to potentiometer outputs 150*a*, 150*b* by op amps 156. Op amps 156 outputs are fed to OR gate inputs 158 and exit as input 160 for logic network 144. Second op amp 162 outputs a high and a low logic signal to dictate which potentiometer output 150*a*, 150*b* is higher. The output of second op amp 162 becomes input 164 of network 144. Logic network 144 compares inputs 146, 148, 160, and 164 to determine outputs 166 that feed relay block 124.

The above motor control circuitry can be used for one, two or more actuators/motors. The motor control circuitry can be designed all analogue by one of ordinary skill in the art. Additionally, if a single actuator is used, the motor control circuitry can be replaced with switching known to those of skill in the art to activate the actuator/motor.

The method of automatically adjusting angle α of speakers 12, 14, 16, 18 is illustrated in FIGS. 7*a* and 7*b*. The method of the present embodiment utilizes the entire array simultaneously for testing and adjustment. Line array speaker system 10 is assembled and placed in a venue 200 near stage 202 (FIG. 8). All speakers in the array are set to 0° (step 300). One or more frequency testing input devices 204 are positioned at chosen acoustical locations of venue 200. Array 10 is activated and emits a test signal 206 and frequency testing input device 204 (FIG. 9) receives the test signal (step 302). A frequency analyzer 208 analyzes the test signal and determines the frequency response and sound pressure level (SPL) (step 304). The frequency analyzer compares the frequency response of the test signal to a predefined optimum frequency response and determines if there is a uniform SPL across the entire venue 200 (step 306). If the frequency responses match within a certain tolerance, and the SPL is uniform across venue 200, the array is properly aligned and adjustment procedure ends (step 310).

In an embodiment, if the frequency responses do not match, frequency analyzer 208 first determines an optimal height 212 of array 10 in relation to a surface 214 (step 308) such as the floor or the stage. Frequency analyzer 208 transmits optimal height 212 to an array height adjustment device 216. Array height adjustment device 216 can be a jack, winch or other motor controlled devices in the speaker adjustment arts. Array height adjustment device 216 determines the present height of array 10 and adjusts the height of array 10 to substantially equal optimal height 212 (step 311). Once the optimal height has been obtained, frequency analyzer 208 determines the necessary angle change to make the first adjustment angle for the array (step 312).

Alternately, the frequency analyzer transmits first adjustment angle Φ to array adjustment device 210 (step 314). Array adjustment device 210 determines which speaker 12, 14, 16, 18 requires adjustment and determines which moving device 33 controls that speaker (step 316). Array adjustment device 210 signals the proper moving device 33 to adjust the speaker (step 318). Array adjustment device 210 then determines if any speaker below the adjusted speaker now requires a tuning adjustment angle $\Delta\Phi$ (step 320).

Wherein, tuning adjustment angle $\Delta\Phi$ is an angle less than first adjustment angle $\Phi$. Array adjusting device 210 adjusts the speaker below the first adjusted speaker by tuning adjustment angle $\Delta\Phi$. Additionally, each speaker in the array may require a separate tuning adjustment angle $\Delta\Phi$. Array adjusting device 210 determines if all speakers that require adjustment are adjusted. If a speaker that requires adjustment is not adjusted, array adjusting device 210 repeats the above steps 320 and 322 for each speaker that requires adjustment (step 326). Once all the speakers in the array are adjusted, the array is again activated (step 328). Steps 302-306 and 312-328 are repeated until the frequency response of the test signal matches within a certain tolerance to a predefined optimum frequency response and the program terminates at step 310.

Alternate embodiments include not setting $\alpha=0$ prior to starting the procedure. Additionally, any speaker in the array can be selected as the first speaker that is adjusted.

Another embodiment of the method to automatically adjusting angle $\alpha$ of speakers 12, 14, 16, 18 is illustrated in FIGS. 10A, 10B and 10C. Line array speaker system 10 is assembled and placed in a venue 200 near stage 202 (FIG. 8). All speakers in the array are set to 0° (step 400). Multiple frequency testing input devices 204 are positioned at chosen acoustical locations in venue 200. Array 10 is activated and emits a test signal 206 and frequency testing input device 204 receives the test signal (step 402). A frequency analyzer 208 analyzes the test signal and determines the frequency response and the uniformity of the SPL throughout the venue 200 (step 404). The frequency analyzer compares the frequency response of the test signal to a predefined optimum frequency response (step 406). If the frequency responses match within a certain tolerance and the SPL is substantially uniform, the array is properly aligned and adjustment procedure ends (step 408).

In an embodiment, if the frequency responses do not match, frequency analyzer 208 first determines an optimal height 212 of array 10 in relation to a surface 214 (step 410) such as the floor or the stage. Frequency analyzer 208 transmits optimal height 212 to an array height adjustment device 216. Array height adjustment device 216 can be a jack, winch or other motor controlled devices in the speaker adjustment arts. Array height adjustment device 216 determines the present height of array 10 and adjusts the height of array 10 to substantially equal optimal height 212 (step 412). If the optimal height has been obtained top speaker 12 in array 10 is selected (step 414) and the frequency analyzer determines the necessary angle change to make a first adjustment angle for the array (step 416).

Alternately, the height need not be determined and a speaker is selected and the frequency analyzer determines the necessary angle change to make a first adjustment angle for the array (step 416). The frequency analyzer transmits first adjustment angle $\Phi$ to the array adjustment device 210 (step 418). Array adjustment device 210 signals the proper actuators to adjust top speaker 12 (step 420). The next speaker below the top speaker, speaker 14, in array 10 is selected (step 422) and steps 416-420 are repeated. Once speaker 14 is adjusted, all of the previously aligned speakers 12, 14 are activated (step 424). A second test signal 206 is emitted and frequency testing input device 204 receives the test signal (step 426). Frequency analyzer 208 analyzes the test signal and determines the frequency response (step 428). Frequency analyzer 208 compares the frequency response of the test signal to a predefined optimum frequency response (step 430). If the frequency responses match within a certain tolerance, then the process continues to the next speaker in the array (step 432). If the frequency response is not within tolerance adjustments are made to correct the angle positions.

An activated speaker adjustment angle is determined (step 434). All speakers activated in step 424 are adjusted by the activated speaker adjustment angle (step 436). The next speaker in array 10 is selected, speaker 16, and steps 416-436 are repeated for both speaker 16 and speakers 12, 14 and 16. The above process is repeated until the frequency response of the test signal matches within a certain tolerance of the predefined optimum frequency response. Additionally, the above is described selecting the first speaker in the array. Any speaker in the array can be chosen and used as the first speaker to be adjusted. Further, speaker angle $\alpha$ need not be set to zero prior to the testing procedures.

A third embodiment for automatically adjusting the angle of a line array includes modeling venue 200 prior to arriving at the venue (step 500). Modeling the venue can be performed with software currently available. Modeling the venue will result in a preliminary angle value $\theta$ for the array. Preliminary angle value $\theta$ can be inputted or preset into the method of either above embodiment. Presetting preliminary angle value $\theta$ replaces steps 300 and 400 and the testing and adjustment methods can proceed as stated above. Beginning the adjustment method with the array set at preliminary angle value $\theta$ reduces the number of cycles the system must repeat to result in the frequency response of the test signal matching within a certain tolerance of the predefined optimum frequency response. Step 500 increases the amount of computer processing time required to set the array but extends the life of actuators 34.

The system is not limited to a wired control mechanism. The system can include a remote capable of controlling the system from remote locations. Possible interfaces include wired, wireless, LAN and Ethernet connections. The remote may be a computer interface, hand pendant, or any device capable of commanding the system.

Additionally, the control system can store angles previously determined for a venue and the information can be reused the next time the system is analyzing the venue. The previously stored values can replace the zeroing and modeling steps 300, 400 and 500.

This system is capable of controlling a single array or multiple arrays at once, allowing venues to be optimized in a shorter period of time. The remote can incorporate a microphone that would allow the user to monitor the system. Additionally, the remote can contain a 'manual override' which allows a user to override the system and manually adjust the array, FIG. 11 illustrates another embodiment of the speaker support bracket 32 which includes a main brace 600 having a left end 602 a right end 604 and a center 606. Attached to left and right ends 602, 604 is a U-shaped speaker attachment bracket 608. Attachment device 610 is disposed at center 606. U-shaped speaker attachment bracket 608 is aligned so that the 'arms' of the "U" are attached to the speaker and the 'open' end of the "U" is pointed in the direction of the speaker.

The present invention is not to be limited in scope by the specific embodiments described herein. Indeed, various modifications of the invention in addition to those described herein will become apparent to those skilled in the art from the foregoing description and the accompanying figures. Such modifications are intended to fall within the scope of the appended claims.

We claim:

1. A method for adjusting a speaker array having a plurality of speakers in a venue, comprising the steps of:

A) emitting a test signal from the array;

B) determining a frequency response of the test signal;

C) comparing the frequency response to a predefined optimum frequency response;

D) if the frequency response does not match the optimum frequency response, determining a first adjustment angle for the array;

E) determining a first speaker of the plurality of speakers that requires adjustment; and F) adjusting the first speaker to the first adjustment angle.

2. The method of claim 1, further comprising the steps of repeating steps A-F until the frequency response matches the optimum frequency response.

3. The method of claim 1, further comprising the steps of:

G) determining if a second speaker, below the first speaker in the array requires a tuning adjustment angle; and H) adjusting the second speaker to the tuning adjustment angle.

4. The method of claim 3, further comprising the steps of repeating steps A-H until the frequency response matches the optimum frequency response.

5. The method of claim 1 further comprising the steps of:

determining an optimal height of the array in relation to a surface, comprising;

determining a present height of array; and adjusting the height of the array to substantially equal the optimal height.

6. The method of claim 1, further comprising the steps of:

determining a sound pressure level of the test signal;

determining if there is a uniform sound pressure level across the entire venue; and if the sound pressure level is not uniform, determining the first adjustment angle for the array accounting for the sound pressure level.

7. The method of claim 1, wherein adjusting the first speaker to the first adjustment angle further comprises the steps of:

determining a moving device that controls the first speaker; and adjusting the moving device.

8. The method of claim 1, further comprising the step of if the frequency response matches the optimum frequency response, ending the procedure.

9. The method of claim 1, further comprising the step of, prior to step A, setting an angle between the plurality of speakers in the array to 0°.

10. A method for adjusting a speaker array having a first, second and third speaker in an array, comprising the steps of:

A) emitting a first test signal from the array;

B) determining a first frequency response of the first test signal;

C) comparing the first frequency response to a predefined optimum frequency response;

D) if the first frequency response does not match the optimum frequency response, determining a first adjustment angle for the first speaker;

E) adjusting the first speaker to the first adjustment angle;

F) emitting a second test signal from the first speaker;

G) determining a second frequency response of the second test signal;

H) comparing the second frequency response to a predefined optimum frequency response;

I) if the second frequency response does not match the optimum frequency response, determining a second adjustment angle for the second speaker; and J) adjusting the second speaker to the second adjustment angle.

11. The method of claim 10, further comprising the steps of:

K) emitting a third test signal from the first and the second speaker;

L) determining a third frequency response of the third test signal;

M) comparing the third frequency response to a predefined optimum frequency response;

N) if the third frequency response does not match the optimum frequency response, determining a third adjustment angle for the third speaker; and O) adjusting the third speaker to the third adjustment angle.

12. The method of claim 10 further comprising the steps of:

determining an optimal height of the array in relation to a surface, comprising;

determining a present height of the array; and adjusting the height of the array to substantially equal the optimal height.

13. The method of claim 10, further comprising the steps of:

determining a sound pressure level of the first test signal;

determining if there is a uniform sound pressure level across the entire venue; and if the sound pressure level is not uniform, determining the first adjustment angle for the array accounting for the first sound pressure level.

14. The method of claim 10, wherein adjusting the first speaker to the first adjustment angle further comprises the steps of:

determining a moving device that controls the first speaker; and adjusting the moving device.

15. The method of claim 10, further comprising the step of if the frequency response matches the optimum frequency response, ending the procedure.

16. The method of claim 10, further comprising the step of, prior to step A, setting an angle between the plurality of speakers in the array to 0°.

17. A speaker array adjustment system, comprising: a first speaker; a second speaker; a pivot point disposed between the first and the second speakers pivotably mounting the first speaker to the second speaker; at least two moving devices each of said moving devices having a fixed end attached to the second speaker and an extension end attached to the first speaker; at least two motors for extending extension ends of said moving devices, said motors being controlled by a motor circuit wherein a position of each of said moving devices is determined by measuring extension of said extension ends; and wherein when extension end of the moving device is extended the first and the second speakers pivot about the pivot point.

18. The speaker array adjustment system of claim 17, wherein the first speaker has a front and a back, the second speaker has a front and a back; and wherein the pivot point is mounted to the front of the first speaker and the front of the second speaker and the moving devices are mounted to the back of the first speaker and the back of the second speaker.

19. The speaker array adjustment system of claim 17, wherein the first speaker has a first support bracket, the second speaker has a second support bracket; and wherein the extension ends of the moving devices are attached to the first support bracket and the fixed end is attached to the second support bracket.

20. The speaker array adjustment system of claim 19, wherein the second support bracket comprises: an arm; a z-arm having: a speaker attachment section attached to the arm and attached to the second speaker; an moving device attachment section; and a transverse section disposed between the speaker attachment section and the moving device attachment section; a fixed end attachment location disposed between the arm and the moving device attachment section for attaching the fixed end of the moving device; and an extension end attachment location disposed between the arm and the moving device attachment section for attaching an extension end of a second moving device.

21. The speaker array adjustment system of claim 19, wherein the second support bracket comprises: a main brace having a left end, a right end, and a center; a left speaker attachment bracket attached to the left end of the main brace and attached to a left side of the second speaker; a right speaker attachment bracket attached to the right end of the main brace and attached to a right side of the second speaker; and an moving attachment device disposed at the center for attaching the fixed end of the actuator and for attaching an extension end of a second actuator.

22. The speaker array adjustment system of claim 17, wherein the moving device is an actuator.

23. The speaker array adjustment system of claim 17, wherein the moving device is at least one of a mechanical, a hydraulic, and an electrical piston and a mechanical, a hydraulic, and an electrical jack.

24. The speaker array adjustment system of claim 17, wherein the first speaker includes an inside and an outside having a aperture therebetween; and wherein the moving device is disposed inside the first speaker and the extension end is disposed through the aperture.

25. The speaker array adjustment system of claim 17, further comprising: a third speaker; a second pivot point disposed between the second and the third speakers pivotably mounting the third speaker to the second speaker; a second moving device having a fixed end attached to the third speaker and an extension end attached to the second speaker; wherein when the extension end of the actuator is extended, the first and the second speakers pivot about the pivot point and the second and the third speakers pivot about the second pivot point; and wherein when the extension end of the second actuator is extended, the second and the third speakers pivot about the second pivot point.

26. The speaker array adjustment system of claim 17, further comprising a wireless control controlling the moving device.

* * * * *